(12) United States Patent
Cheon et al.

(10) Patent No.: US 11,189,682 B2
(45) Date of Patent: Nov. 30, 2021

(54) DISPLAY DEVICE AND METHOD OF MANUFACTURING THE SAME

(71) Applicant: Samsung Display Co., Ltd., Yongin-Si (KR)

(72) Inventors: Soo Hong Cheon, Seoul (KR); Sun Kwun Son, Suwon-si (KR); Dong Hee Shin, Asan-si (KR)

(73) Assignee: Samsung Display Co., Ltd.

( * ) Notice: Subject to any disclaimer, the term of this patent is extended or adjusted under 35 U.S.C. 154(b) by 100 days.

(21) Appl. No.: 16/690,021

(22) Filed: Nov. 20, 2019

(65) Prior Publication Data
US 2020/0312939 A1 Oct. 1, 2020

(30) Foreign Application Priority Data
Mar. 25, 2019 (KR) .......................... 10-2019-0033925

(51) Int. Cl.
*H01L 21/00* (2006.01)
*H01L 27/32* (2006.01)
*G02F 1/1362* (2006.01)

(52) U.S. Cl.
CPC .... *H01L 27/3276* (2013.01); *G02F 1/136286* (2013.01); *H01L 27/322* (2013.01)

(58) Field of Classification Search
CPC ............... H01L 27/3276; H01L 27/322; G02F 1/136286
See application file for complete search history.

(56) References Cited

U.S. PATENT DOCUMENTS

| | | | | |
|---|---|---|---|---|
| 5,126,286 A | * | 6/1992 | Chance | H01L 23/485 257/782 |
| 5,600,101 A | * | 2/1997 | Sakai | H01G 4/232 174/261 |
| 7,791,173 B2 | * | 9/2010 | Park | H01L 24/13 257/620 |
| 7,810,908 B2 | * | 10/2010 | Chikamoto | B41J 2/14209 347/50 |
| 9,059,385 B2 | * | 6/2015 | Yoon | H01L 33/62 |
| 9,899,323 B2 | * | 2/2018 | Seong | H01L 24/09 |
| 10,325,869 B2 | * | 6/2019 | Choi | H01L 24/13 |

(Continued)

FOREIGN PATENT DOCUMENTS

| | | | | |
|---|---|---|---|---|
| CN | 111736394 A | * | 10/2020 | G02F 1/1345 |
| KR | 10-2007-0059668 A | | 6/2007 | |

(Continued)

*Primary Examiner* — Laura M Menz
(74) *Attorney, Agent, or Firm* — Innovation Counsel LLP

(57) ABSTRACT

A display device may include a first substrate, a first conductive pad, a second conductive pad, a first pad electrode, and a second pad electrode. The first substrate may include a first face and a second face. The first conductive pad may be disposed on the first face. The second conductive pad may be disposed on the first face and may be spaced from the first conductive pad. The first pad electrode may be disposed on the second face, may be electrically connected to the first conductive pad, and may include a protrusion. The second pad electrode may be disposed on the second face, may be electrically connected to the second conductive pad, may be spaced from the first pad electrode, and may include a recess. The protrusion of the first pad electrode may be partially inside the recess the second pad electrode.

17 Claims, 11 Drawing Sheets

(56) References Cited

U.S. PATENT DOCUMENTS

| | | | | |
|---|---|---|---|---|
| 10,340,284 B2* | 7/2019 | Kim | ............... | H01L 27/11582 |
| 10,643,931 B2* | 5/2020 | Ha | ............... | H01L 24/13 |
| 10,763,242 B2* | 9/2020 | Son | ............... | H01L 21/76877 |
| 10,849,226 B2* | 11/2020 | Hwang | ............... | H05K 1/116 |
| 10,887,986 B2* | 1/2021 | Hwang | ............... | H05K 3/4038 |
| 10,943,971 B2* | 3/2021 | Park | ............... | H05K 1/147 |
| 10,950,544 B2* | 3/2021 | Lee | ............... | H01L 21/76816 |
| 2006/0006521 A1* | 1/2006 | Boon | ............... | H01L 25/105 |
| | | | | 257/701 |
| 2020/0111733 A1* | 4/2020 | Yamaji | ............... | H01L 21/3043 |
| 2020/0312939 A1* | 10/2020 | Cheon | ............... | G02F 1/1345 |

FOREIGN PATENT DOCUMENTS

| | | |
|---|---|---|
| KR | 10-2015-0011731 A | 2/2015 |
| KR | 10-2017-0080311 A | 7/2017 |
| KR | 10-2017-0125187 A | 11/2017 |
| KR | 20200115769 A * | 10/2020 ......... H01L 27/3276 |

* cited by examiner

DISPLAY DEVICE AND METHOD OF MANUFACTURING THE SAME

CROSS-REFERENCE TO RELATED APPLICATION

This application claims priority to and benefits of Korean Patent Application No. 10-2019-0033925 filed in the Korean Intellectual Property Office on Mar. 25, 2019; the entire contents of the Korean Patent Application are incorporated herein by reference.

BACKGROUND

(a) Technical Field

The technical field relates to a display device and a method for manufacturing the display device.

(b) Description of the Related Art

A display device, such as a liquid crystal display (LCD), an organic light emitting diode display (OLED), or a quantum display device may include a display panel and a driving circuit. The display panel may include a plurality of pixels capable of displaying an image. The driving circuit may be positioned at a side of the display panel and may control the display panel.

The above information disclosed in this Background section is for enhancement of understanding of the background of the application. This Background section may contain information that does not form the prior art that is already known in this country to a person of ordinary skill in the art.

SUMMARY

Embodiments may be related a display device and a method for manufacturing the display device. According to embodiments, pad electrodes in a display panel of the display device may include protrusions for preventing a laser beam from reaching other components of the display panel. Advantageously, satisfactory reliability of the display device may be attained.

An embodiment may be related to a display device that includes the following elements: a display panel including a wiring layer; and a flexible circuit board disposed on a first side surface of the display panel extending in a first direction to include side pads, wherein the wiring layer includes pad electrodes, the pad electrodes have a convex portion at a first side and a recess portion at a second side opposite to the first side, the convex portion and the recess portion between adjacent pad electrodes are disposed to be engaged with each other, and the side pads are electrically connected to the respective pad electrodes on the first side surface of the display panel.

The display panel may further have a second side surface that extends in a second direction, the second direction may intersect the first direction, and the flexible circuit board may be disposed on the second side surface.

The convex portion may be protruded by a first width in one direction from the first side, and the recess portion may be recessed in said one direction from the second side by a second width.

The convex portion and the recess portion may have shapes corresponding to each other.

The convex portion may include an overlapped portion that is disposed to be deeper than an outermost side of a pad electrode adjacent thereto, and the overlapped portion may have a third width.

The first width and the second width may be greater than or equal to the third width.

Each of the convex portion and the recess portion may have a polygonal shape.

The first side may include at least two convex portions, and the second side may include recess portions in a same number as the convex portions to be engaged with the first side.

Each of the convex portion and the recess portion may have a shape including a curved portion.

The display panel may include a first display panel and a second display panel which are bonded to face each other, and the first substrate may include the wiring layer.

The wiring layer may include a first wiring layer and a second wiring layer, the first wiring layer may include a first pad layer, the second wiring layer may include a second pad layer, and the first pad layer and the second pad layer may constitute the pad electrode.

The first pad layer and the second pad layer may directly contact each other.

The first wiring layer may further include a gate electrode, and the second wiring layer may further include a data line, a first electrode, and a second electrode.

A semiconductor layer may be disposed on the gate electrode, and the gate electrode, the semiconductor layer, the first electrode, and the second electrode may constitute a transistor.

The second display panel may include a color filter.

A data driver or a gate driver may be mounted on the flexible circuit board, and a driving circuit board may be electrically connected to the flexible circuit board.

The side pads may be disposed at portions corresponding to the pad electrodes on the first side surface of the display panel.

An embodiment may be related a method for manufacturing a display device. The method may include the following steps: cleaning one side surface of a display panel including a first display panel and a second display panel that are bonded to face each other; applying a conductive paste to said one side of the display panel after the cleaning; and forming side pads by patterning the conductive paste with a laser beam after the applying, wherein the first display panel includes a wiring layer, a transistor, and a light emitting element, the wiring layer includes pad electrodes, the pad electrodes have a convex portion at a first side and a recess portion at a second side opposite to the first side, and the side pads are electrically connected to the respective pad electrodes on said one side surface of the display panel.

The convex portion may be protruded by a first width in one direction from the first side, the recess portion may be recessed in said one direction from the second side by a second width, the convex portion and the recess portion may be disposed to be engaged with each other, and the convex portion may include an overlapped portion that is disposed to be deeper than an outermost side of a pad electrode adjacent thereto.

In the forming of the side pads, the laser beam that is applied to the convex portion of the pad electrode may not reach the wiring layer, the transistor, or the light emitting element.

An embodiment may be related to a display device. The display device may include a first substrate, a first conductive pad, a second conductive pad, a first pad electrode, and a second pad electrode. The first substrate may include a first face and a second face. The first conductive pad may be disposed on the first face. The second conductive pad may be disposed on the first face and may be spaced from the first conductive pad. The first pad electrode may be disposed on the second face, may be electrically connected to the first conductive pad, and may include a protrusion. The second pad electrode may be disposed on the second face, may be electrically connected to the second conductive pad, may be spaced from the first pad electrode, and may include a recess. The protrusion of the first pad electrode may be partially inside the recess of the second pad electrode.

The display device may include a third conductive pad. The first substrate may include a third face. The third conductive pad may be disposed on the third face.

The display device may include the following elements: a third conductive pad disposed on the first face and spaced from the second conductive pad; and a third pad electrode disposed on the second face, electrically connected to the third conductive pad, spaced from the second pad electrode, and including a concave structure. The second pad electrode may include a convex structure. The convex structure of the second pad electrode may be partially inside the concave structure of the third pad electrode.

The protrusion may be wider than a gap between the first pad electrode and the second pad electrode in a lengthwise direction of the first face. The gap may be positioned between the protrusion and the first face.

A shape of the protrusion may correspond to a shape of the recess.

The display device may include a signal line disposed on the second face and electrically connected to at least one of the first pad electrode and the second pad electrode. The protrusion may be positioned between the signal line and the first face.

A first edge of the protrusion may be positioned between a second edge of the protrusion and the first face and may be curved or oblique relative to the first face in a plan view of the display device.

Each of the protrusion and the recess may have a polygonal shape in a plan view of the display device.

The first pad electrode may include at least two protrusions. The second pad electrode may include at least two recesses. The at least two protrusions may be partially inside the at least two recesses, respectively.

Each of the protrusion and the recess has a curved portion in a plan view of the display device.

The display device may include a second substrate. The first pad electrode and the second pad electrode may be positioned between the first substrate and the second substrate. The first conductive pad and the second conductive pad may be disposed on a first face of the second substrate.

The first pad electrode may include a first pad layer and a second pad layer. A material of the first pad layer may be different from a material of the second pad layer. At least one of the first pad layer and the second pad layer may directly contact the first conductive pad.

The first pad layer may directly contact the second pad layer.

The display device may include the following elements: a gate electrode overlapping the second face and configured to receive a gate signal; and a data line overlapping the second face and configured to transmit a data signal. The material of the first pad layer may be identical to a material of the gate electrode. The material of the second pad layer may be identical to a material of the data line.

The display device may include a transistor. At least one of the material of the first pad layer and the material of the second pad layer may be identical to a material of an electrode of the transistor. The transistor may be disposed on the first substrate.

The display device may include the following elements: a color filter disposed on the second substrate; and a light blocking member disposed on the second substrate. At least one of the color filter and the light blocking member may overlap the first pad electrode.

The display device may include a data driver or a gate driver electrically connected to at least one of the first conductive pad and the second conductive pad.

The first conductive pad may directly contact the first pad electrode. The second conductive pad may directly contact the second pad electrode.

An embodiment may be related to method for manufacturing a display device. The method may include the following steps: cleaning a first face of a first substrate and a first face of a second substrate, wherein the second substrate overlaps the first substrate; applying a conductive paste to the first face of the first substrate and the first face of the second substrate after the cleaning; providing a first pad electrode and a second pad electrode on a second face of the first substrate, wherein the first pad electrode includes a protrusion, wherein the second pad electrode includes a recess, and wherein the protrusion may be partially inside the recess; and forming a first conductive pad and a second conductive pad by patterning the conductive paste with a laser beam, wherein the first conductive pad and the second conductive pad may be respectively electrically to the first pad electrode and the second pad electrode.

The method may include the following steps: providing a signal line on the second face of the first substrate, wherein the signal line may be electrically connected to at least one of the first pad electrode and the second pad electrode; and using the protrusion to block at least a portion of the laser beam from reaching the signal line.

The method may include the following steps: providing a transistor on the second face of the first substrate; and using the protrusion to block at least a portion of the laser beam from reaching the transistor.

According to the embodiments, when a laser beam is used for forming side pads (or conductive pads) on one side surface of a display panel, one or more protrusions of one or more pad electrodes may prevent the laser beam from reaching signal lines, transistors, and other components of the display panel. Advantageously, satisfactory reliability of the display panel may be attained. Since no additional protective structures may be needed for protecting the components from the laser beam, the size and/or the cost of the display panel may be minimized.

DETAILED DESCRIPTION

Figure 1:
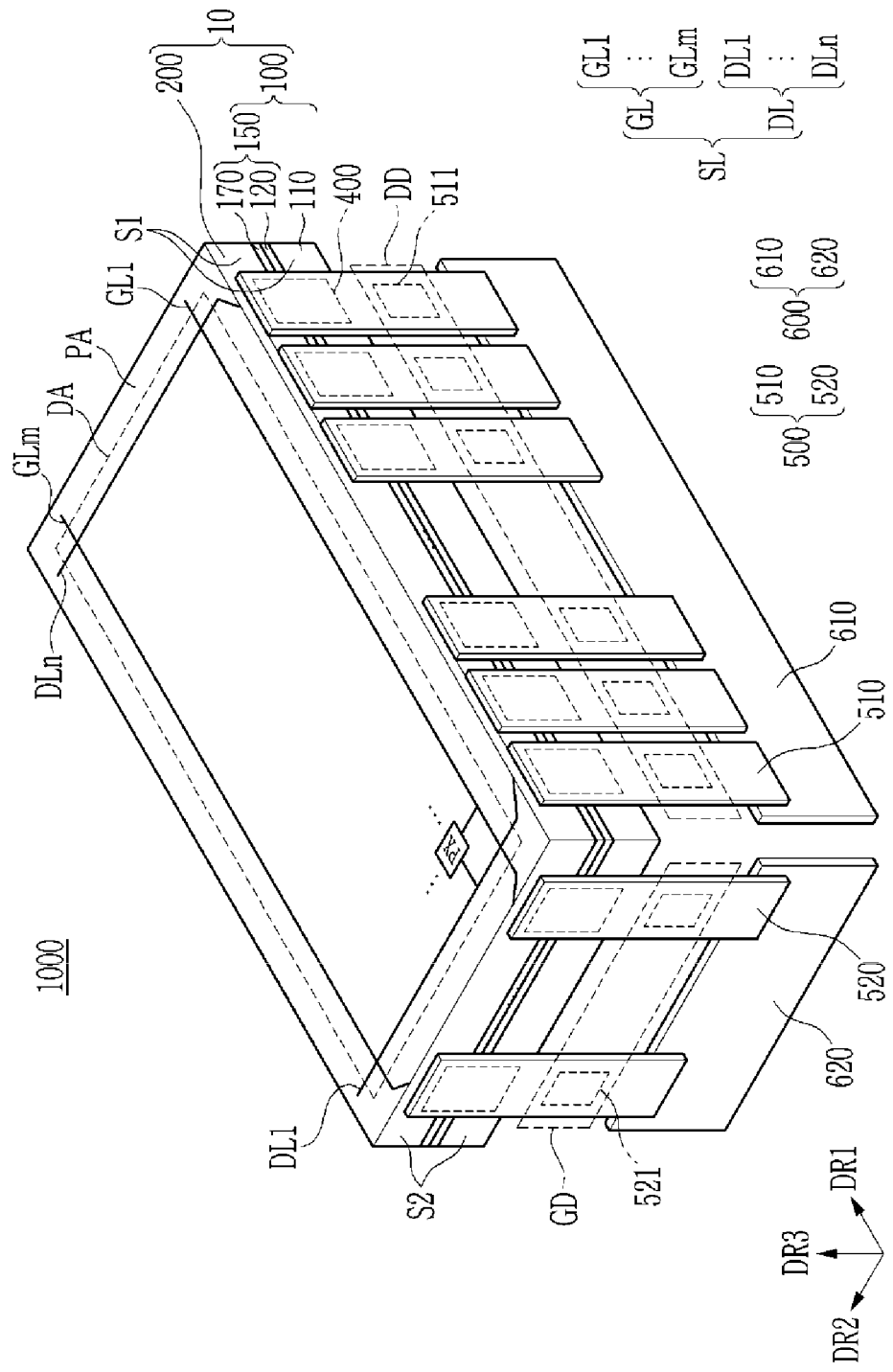
FIG. 1 illustrates a schematic perspective view of a display device according to an embodiment.

Example embodiments are described with reference to the accompanying drawings. The described embodiments may be modified in various ways.

Like numerals may refer to similar elements in the application.

In the drawings, dimensions of elements may be exaggerated for clarity.

Although the terms "first," "second," etc. may be used to describe various elements, these elements, should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the other element, or one or more intervening elements may be present between the first element and the second element. When a first element is referred to as being "directly on" a second element, there are no intended intervening elements (except environmental elements such as air) present between the first element and the second element. The word "over" or "on" means positioning on or below an object, and does not necessarily mean positioning on the upper side of the object based on a gravity direction.

Unless explicitly described to the contrary, the word "comprise" and variations such as "comprises" or "comprising" may imply the inclusion of stated elements but not the exclusion of any other elements.

Figure 2:
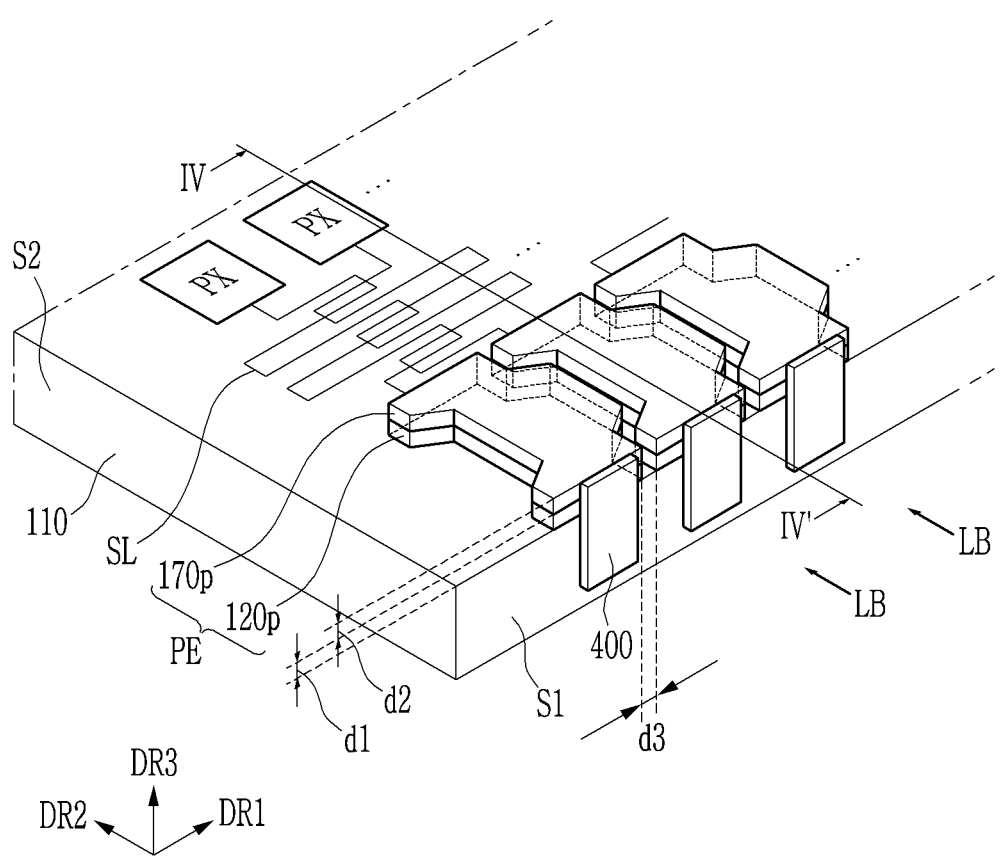
FIG. 2 illustrates a schematic perspective view of a portion of a display device according to an embodiment.
Figure 3:
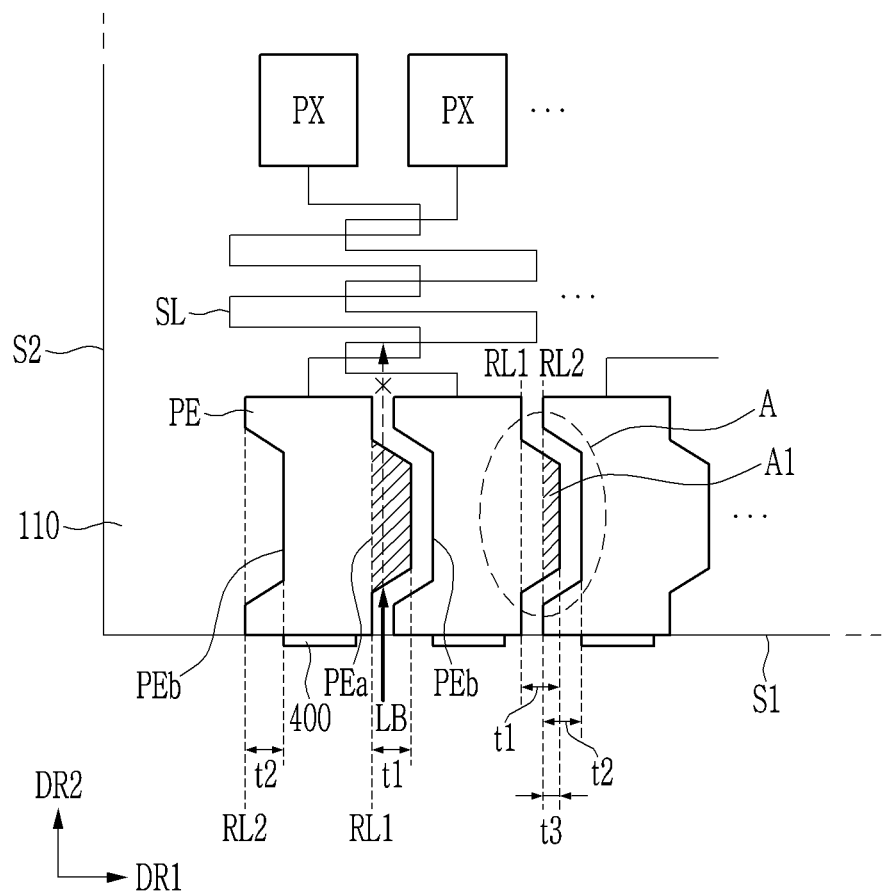
FIG. 3 illustrates a schematic top plan view of a portion of a display device according to an embodiment.
Figure 4:
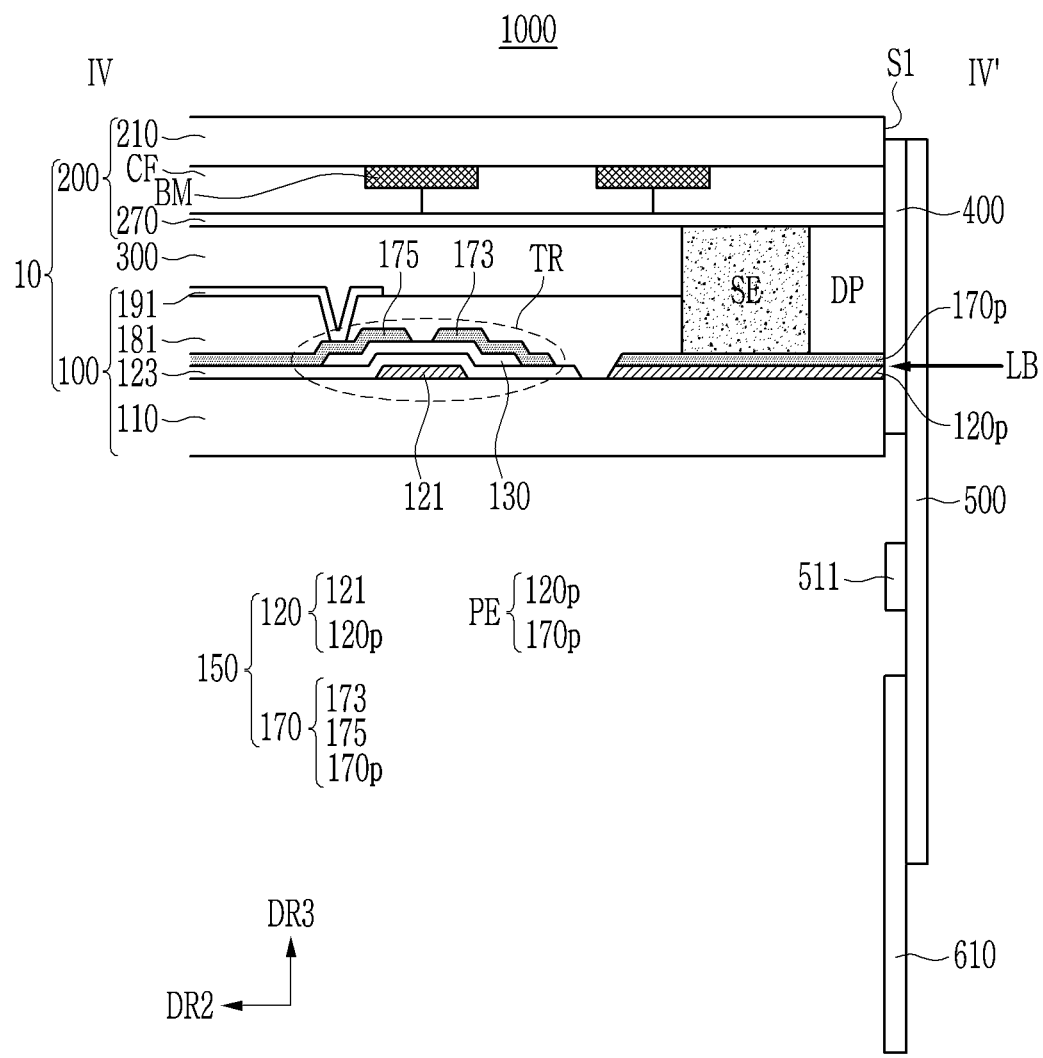
FIG. 4 illustrates a cross-sectional view taken along a line IV-IV' of FIG. 2 according to an embodiment.

In this application, "connect" may mean "electrically connect"; "insulate" may mean "electrically insulate"; "convex portion" or "convex structure" may mean "protrusion"; "recess portion" or "concave structure" may mean "recess"; "side" or "surface" may mean "face"; "contact" may mean "direct contact" or "directly contact"; "engagement portion" may mean "overlap structure." FIG. 1 illustrates a schematic perspective view of a display device according to an embodiment. FIG. 2 illustrates a schematic perspective view of a portion of the display device according to an embodiment. FIG. 3 illustrates a schematic top plan view of a portion of the display device according to an embodiment. FIG. 4 illustrates a cross-sectional view taken along a line IV-IV' of FIG. 2 according to an embodiment.

Referring to FIG. 1, a display device 1000 includes a display panel 10, a flexible circuit board 500 (or flexible circuit board set 500) attached to one side of the display panel 10, and a driver circuit board 600 (or driver circuit board set 600) connected to the flexible circuit board 500. The display panel 10 includes a first display panel 100 and a second display panel 200.

The first display panel 100 and the second display panel 200 may be attached to each other, and the display panel 10 (and/or the display device 1000) may further include a backlight unit overlapping the first display panel 100.

The display device 1000 may be a liquid crystal display (LCD) with a liquid crystal layer 300 (see FIG. 4) interposed between the first display panel 100 and the second display panel 200. In embodiments, the display device 1000 may include/be an organic light emitting diode display in which an organic light emitting diode is disposed between the first display panel 100 and the second display panel 200. In embodiments, at least one of the first display panel 100 and the second display panel 200 may include a touch electrode capable of sensing a touch. According to an embodiment, the display device 1000 may include/be a quantum dot-organic light emitting diode (QD-OLED) display that includes a color conversion layer between the first display panel 100 and the second display panel 200. The display device 1000 according to an embodiment may include a quantum dot-light emitting diode display (QLED) including a color conversion layer that includes a quantum dot. In embodiments, the display device 1000 may include a backlight unit that emits blue light.

Referring to FIG. 4, the first display panel 100 may include a transistor TR (e.g., a thin film transistor, TFT), and the second display panel 200 may include a color filter CF. According to an embodiment, a transistor TR and a color filter CF are disposed on a same substrate.

Each of the first display panel 100 and the second display panel 200 may have a rectangular shape having long sides that extend in a first direction DR1 and short sides that extend in a second direction DR2 (different from the first direction DR1) in a plan view of the display panel 10. According to an embodiment, the first display panel 100 and the second display panel 200 may have curved portions. The display panel 10 may include a first side surface S1 corresponding to one of the long sides and a second side surface S2 corresponding to one of the short sides. The display panel 10 may have four side surfaces, i.e., a first side surface S1 and a side surface opposite the first side surface S1, a second side surface S2, and a side surface opposite the second side surface S2. The display panel 10 may have a top/front face and a bottom/rear face.

The first display panel 100 includes a first substrate 110 and a plurality of thin film layers disposed on the first substrate 110. A wiring layer 150 is disposed on the first substrate 110, and the wiring layer 150 includes a first wiring layer 120 and a second wiring layer 170. The wiring layer 150 may include transistors TR and/or light emitting elements in a display unit DA. The wiring layer 150 may include pad electrodes PE in a peripheral area PA.

The flexible circuit board 500 and the driving circuit board 600 (for driving the display device 1000) are disposed on one or more side surfaces of the display panel 10. The flexible circuit board 500 may include a first flexible circuit board 510 and a second flexible circuit board 520. The driving circuit board 600 may include a first driving circuit board 610 and a second driving circuit board 620. The first flexible circuit board 510 and the first driving circuit board 610 are disposed on a first side surface S1 of the display device 1000, and the second flexible circuit board 520 and the second driving circuit board 620 are disposed on a second side surface S2 of the display device 1000.

The flexible circuit board 500 may be connected to a signal line SL of the display panel 10 through a side pad 400 (or conductive pad 400). The signal line SL may be a component of the wiring layer 150.

The first flexible circuit board 510 and the first driving circuit board 610 may be disposed on the first side surface S1, and/or the second flexible circuit board 520 and the second driving circuit board 620 may be disposed on the second side surface S2. The flexible circuit board 500 and the driving circuit board 600 may be disposed on at least one of the four side surfaces of the display device 1000. A position where the flexible circuit board 500 or the side pad 400 is connected to the display panel 10 may be configured according to embodiments.

The flexible circuit board 500 is attached to one side surface of the display panel 10, and the side pad 400 (illustrated by a dotted line) is disposed between the flexible circuit board 500 and the side surface of the display panel 10. The one side surface may include at least one of the first surface side S1, the second side surface S2, and the two side surfaces opposite the first side surface S1 and the second side surface S2.

The side pad 400 is in contact with and electrically connected to the wiring layer 150 (disposed on the first substrate 110). The side pad 400 may directly contact a corresponding pad electrode PE.

The side pad 400 may be attached to the flexible circuit board 500 through an adhesive film (not illustrated). The adhesive film may be optional.

A data driver DD including at least one driving chip 511 may be disposed on the first flexible circuit board 510, and a gate driver GD including at least one driving chip 521 may be disposed on the second flexible circuit board 520.

The driving circuit board 600 may be electrically connected to one end of the flexible circuit board 500. Connection wires (not illustrated) may be electrically connected with each other at an overlap between the flexible circuit board 500 and the driving circuit board 600. Electrical signals such as a gate signal, a data signal, and image data from the driving circuit substrate 600 may be transferred to the flexible circuit board 500, and then transferred to the wiring layer 150 of the display panel 10 through the side pad 400.

According to an embodiment, in the display device, when a laser beam LB is irradiated toward one side surface of the display panel 10 to form side pads 400 on the side surface of the display panel 10, protrusions of pad electrodes PE may prevent the laser beam LB from reaching signal lines SL, transistors TR, and other components in the display area DA, thereby preventing damage to the display panel 10.

When the display device 1000 is an organic light emitting diode (OLED) display, the laser beam LB may be prevented from reaching a light emitting element.

As a result, wiring failure of the display device 1000 t may be prevented, such that satisfactory reliability of the display device 1000 may be attained.

In addition, since it is not necessary to form an additional structure to protect the signal line SL etc., the size and/or cost of the display device 1000 may be minimized.

Main surfaces of the first display panel 100 and the second display panel 200 may overlap. The main surfaces of the first display panel 100 and the second display panel 200 may have edges extending in the first direction DR1 and the second direction DR2.

Each of the first display panel 100 and the second display panel 200 may include glass or the like having rigidity, and/or may include plastic or the like having flexibility. The first display panel 100 and the second display panel 200 may include one or more flexible materials and/or one or more flexible structures, such as one or more of polyethylene terephthalate (PET), polyethylene naphthalate (PEN), polycarbonate (PC), polyarylate (PAR), polyetherimide (PEI), polyether sulfone (PES), polyimide (PI), a metal thin film, and an ultra-thin glass.

The display panel 10 includes the display area DA for displaying an image and may include the peripheral area PA around the display area DA. The peripheral area PA may be referred to as a non-display area, a bezel region, or the like. The peripheral area PA may surround the display area DA.

A plurality of pixels PX and a plurality of signal lines SL are located in the display area DA. Each of the pixels PX may include at least one pixel electrode 191 (see FIG. 4) and may emit light of luminance corresponding to a grayscale of an input image signal. A pixel PX may include a light emitting element, a transistor TR, and the like configured to emit light. The plurality of pixels PX may be arranged in a matrix form.

The signal lines SL includes m gate lines GL (GL1, . . . , and GLm) and n data lines DL (DL1, . . . , and DLn). The gate lines GL may intersect the data lines DL and may be insulated from the data lines DL. The gate lines GL may be extended in the first direction DR1 and may be electrically connected to the gate driver GD. The data lines DL may be extended in the second direction DR2 and may be electrically connected to the data driver DD. The data lines DL may extend in the second direction DR2 and may be bent at the first side surface S1 to extend in a third direction DR3 to be electrically connected to the data driver DD. The gate lines GL may extend in the first direction DR1 and may be bent at the second side surface S2 to extend in the third direction DR3 to be electrically connected to the gate driver GD.

The data driver DD may include at least one driving chip 511. Although six driving chips 511 are illustrated in FIG. 1, a number of driving chips 511 may be configured according to particular embodiments. The gate driver GD may include at least one driving chip 521. Although two driving chips 521 are illustrated in FIG. 1, a number of driving chips 521 may be configured according to particular embodiments.

The driving circuit board 600 may include a timing controller (not illustrated). The timing controller may be mounted on the driving circuit board 600 in the form of an integrated circuit (IC) chip and may be electrically connected to the gate driver GD and the data driver DD. The timing controller may output a gate control signal, a data control signal, and image data. According to an embodiment, a timing controller may be formed as an integrated circuit (IC) chip together with a data driver (DD) on the flexible circuit board 500.

The flexible circuit boards 500 may be bent for the gate driver GD, the data driver DD, and the driving circuit board 600 to be positioned on a back surface (also referred to as a bottom surface) of the first display panel 100 of the display panel 10, so that the driving units may be hidden when the display device 1000 is viewed from above in the third direction DR3.

The gate driver GD may receive a gate control signal from the timing controller. The gate driver GD may generate gate signals in response to the gate control signal to sequentially output the generated gate signals. The gate signals may be supplied to the pixel PX on a row basis through the gate lines GL. As a result, the pixels PX may be driven row by row.

The data driver DD may receive video data and a data control signal from the timing controller. The data driver DD may generate and output analog data voltages corresponding to the video data in response to the data control signal. The data voltages may be supplied to the pixels PX through the data lines DL.

The display area DA, the peripheral area PA, the plurality of signal lines SL, and the plurality of pixels PX may be disposed on the second display panel 200 and/or the first display panel 100.

The gate driver GD may be mounted on the flexible circuit board 520 by a tape carrier package (TCP) method.

In an embodiment, the gate driver GD may be formed in a manufacturing process of the transistors TR and may be mounted on the first display panel 100 in a form of an amorphous silicon TFT gate driver circuit (ASG) or an oxide silicon TFT gate driver circuit (OSG).

The pixels PX may receive data voltages through the data lines DL in response to gate signals transmitted through the gate lines GL. Each of the pixels PX may display a grayscale corresponding to a data voltage.

FIG. 2 illustrates a schematic perspective view of a portion of a display device according to an embodiment.

In FIG. 2, a portion of the first display panel 100 is illustrated. The first display panel 100 may include a first substrate 110, pad electrodes PE disposed on the first substrate 110, signal lines SL, pixels PX, and side pads 400. The pad electrodes PE are disposed in the peripheral area PA (see FIG. 1) of the display panel 10. Three pad electrodes PE are illustrated, but a number of pad electrodes PE may be configured according particular embodiments.

The wiring layer 150 includes a first wiring layer 120 and a second wiring layer 170, the first wiring layer 120 includes first pad layers 120p, and the second wiring layer 170 includes second pad layers 170p. A pad electrode PE may include a first pad layer 120p and a second pad layer 170p.

The first pad layer 120p may include a same material as the first wiring layer 120, and the second pad layer 170p may include a same material as the second wiring layer 170. In embodiments, no insulating layer is disposed between the first pad layer 120p and the second pad layer 170p of a pad electrode PE, and the first pad layer 120p and the second pad layer 170p may directly contact each other. Therefore, a contact area with a corresponding side pad 400 may be widened, such that contact resistance in the display device 1000 may be minimized.

The first pad layer 120p and the second pad layer 170p have a first thickness d1 and a second thickness d2, respectively. The first thickness d1 and the second thickness d2 each may be a thickness of a commonly used wire.

Adjacent pad electrodes PE may be spaced by predetermined and/or constant distances.

The signal lines SL and the pixels PX may be connected to the pad electrodes PE. The signal lines SL may be electrically connected to the pad electrodes PE and may include the gate lines GL and the data lines DL described with reference to FIG. 1. The gate lines GL may be part of the first wiring layer 120 and may be formed of a material of the first wiring layer 120, and the data line DL may be part of the second wiring layer 170 and may be formed of a material of the second wiring layer 170. An insulating layer may insulate the gate lines GL from the data lines DL.

A side pad 400 may contact and may be electrically connected to a corresponding pad electrode PE. The flexible circuit board 500 may cover the side pads 400, and electrical signals generated from the data driver DD and the driving circuit board 600 may be transferred to the display panel 100 through the side pads 400.

The side pad 400 is formed by printing a metal layer (such as Ag) and then patterning the metal layer using a laser beam LB.

Since pad electrodes PE are spaced apart, if the laser beam LB is not blocked, the laser beam LB may irradiate through gaps between adjacent pad electrodes PE and may cause damages to signal lines SL and/or other components inside the display panel 100.

According to an embodiment, each pad electrode PE includes a convex portion PEa and a recess portion PEb, and immediately adjacent pad electrode PEs overlap each other in the irradiation direction of the laser beam LB (i.e., the second direction). The convex portions PEa and recess portions PEb may effective block the laser beam LB, thereby preventing damage to the signal lines SL, etc.

FIG. 3 illustrates a schematic top plan view of the display panel 100 according to an embodiment.

Each pad electrode PE includes a convex portion PEa and a recess portion PEb. Each pad electrode PE includes a first side RL1 and a second side RL2 opposite the first side RL1. Referring to FIG. 3, a right side is described as a first side RL1, and a left side is described as a second side RL2. The second side RL2 is an outermost left side of the pad electrode PE. The first side RL1 and the second side RL2 may be parallel.

The convex portion PEa protrudes from the first side RL1 of the pad electrode PE to the right by a first width t1. The recess portion PEb is recessed from the second side RL2 of the pad electrode PE to the right by a second width t2. The first width t1 may be equal to, may be unequal to, or may approximate the second width t2. The convex portion PEa of a pad electrode PE may be partially positioned inside the recess portion PEb of an immediately neighboring pad electrode.

A side pad 400 (formed on the first side surface S1) may correspond to each pad electrode PE (formed on a main face of the first substrate 110). Side pads 400 may respectively contact pad electrodes.

An engaged portion A (or overlap structure A) may be formed between adjacent pad electrodes PE. At the engaged portion A, the convex portion PEa of a first pad electrode PE may be partially inside the recess portion PEb of a second pad electrode PE. A shape of the convex portion Pea of the first pad electrode PE may correspond to, may be similar to, and/or may be identical to a shape of the recess portion PEb of the second pad electrode PE. A distance from the convex portion PEa to the first side surface S1 may be unequal to a distance from the recess portion PEb to the first side surface S1.

The engaged portion A includes an overlapped portion A1 in which the convex portion PEa of the first pad electrode PE and the recess portion PEb of the second pad electrode PE overlap in the second direction DR2. A width of the overlapped portion A1 is equal to an overlap width of the first width t1 and the second width t2, and is hereinafter referred to as a third width t3. At the engaged portion A, the convex portion PEa may pass the second side RL2 to the right by the third width t3 to be partially inside the recess portion PEb. The engaged portion A may block the laser beam LB from traveling through a gap between the two adjacent pad electrodes PE. Each of the first width t1 and the second width t2 may be greater than the third width t3.

According to an embodiment, pad electrodes PE may have convex portions PEa and recess portions PEb, so that the laser beam LB irradiated to form the side pads 400 may be prevented from reaching the signal lines SL. The laser beam LB may be blocked by the convex portions PEa, may be reflected between the convex portions PEa and the recess portions PEb, and may not pass the pad electrodes PE. If the convex portion PEa of a pad electrode PE does not extend into the recess portion PEb of an immediately neighboring pad electrode PE, a gap may be left between the two pad electrodes PE and may undesirably allow the laser beam LB to flow into the gap. Therefore, the overlapped portion A1 having the positive third width t3 should be formed at the engaged portion A.

A structure in which a convex portion PEa is partially inside a corresponding recess portion PEb may effectively block the laser beam LB. Thus, damage to components of the display panel 10 may be prevented. Advantageously, satisfactory quality and reliability of the display device may be attained.

In an embodiment, a convex portion PEa may be at a second side RL2, and a recess portion PEb may be at a first side RL1.

A first pad electrode PE may have a convex portion PEa and a recess portion PEb on one side, and a second pad electrode PE immediately adjacent to the first pad electrode PE may have a corresponding recess portion PEb and a corresponding convex portion PEa on one side. The convex portions PEa may be partially inside corresponding recess portions PEb, respectively.

Each of the convex portion PEa and the recess portion PEb may have a trapezoidal polygonal shape (such that the laser beam LB may not be significantly reflected to the laser device), a rectangular shape, a curved portion (such that the laser beam LB may not be significantly reflected to the laser device), and/or one or more other structures.

FIG. 4 illustrates a cross-sectional view taken along a line IV-IV' of FIG. 2 according to an embodiment.

Referring to FIG. 4, the display device 1000 a display panel 10, a flexible circuit board 500 attached to one side of the display panel 10, and a driving circuit board 600 overlapping the flexible circuit board 500.

The display panel 10 includes a first display panel 100 and a second display panel 200 bonded to each other, and a liquid crystal layer 300 interposed between the panels 100 and 200.

The first display panel 100 may include a first substrate 110, a first wiring layer 120, an insulating layer 123, a semiconductor layer 130, a second wiring layer 170, a passivation layer 181, and a pixel electrode 191. The first wiring layer 120 and the second wiring layer 170 may constitute a wiring layer 150.

The first wiring layer 120 is disposed on the first substrate 110 and includes a first pad layer 120p including a gate line (not illustrated), a gate electrode 121, and a layer of a pad electrode PE. The insulating layer 123 is disposed on the first wiring layer 120 and may be a gate insulating layer. The semiconductor layer 130 is disposed on the insulating layer 123 and overlaps the gate electrode 121.

The second wiring layer 170 is disposed on the semiconductor layer 130. The second wiring layer 170 may include a data line (not illustrated), a first electrode 173, a second electrode 175, and a second pad layer 170p. The first electrode 173 and the second electrode 175 are respectively disposed at portions corresponding to opposite ends of the semiconductor layer 130. When one of the first electrode 173 and the second electrode 175 is a source electrode, the other may be a drain electrode. The first electrode 173 may protrude from the data line (not illustrated). The data line (not illustrated) may be a data line DL described with reference to FIG. 1, and may transfer a data signal to the pixel PX.

A gate line (not illustrated) of the first wiring layer 120, the gate electrode 121, the data line (not illustrated) of the wiring layer 170, the first electrode 173, and the second electrode 175 serve as driving wires for driving the display device 1000, and the insulating layer 123 is disposed between portions of the two layers 120 and 170 to provide insulation. The first pad layer 120p and the second pad layer 170p forming the pad electrode PE may directly contact each other.

Each of the first wiring layer 120 and the second wiring layer 170 may include a conductive metal such as Ti and/or Cu. The first wiring layer 120 and the second wiring layer 170 may include a single layer or two or more layers.

The gate electrode 121, the semiconductor layer 130, the first electrode 173, and the second electrode 175 may constitute a transistor TR. Although the transistor TR having a bottom gate structure is illustrated in FIG. 3, the transistor TR may have a top gate structure in which the gate electrode 121 is disposed on the semiconductor layer 130.

A passivation layer 181 and a pixel electrode 191 are disposed on the transistor TR.

The pixel electrode 191 may include indium tin oxide (ITO), indium zinc oxide (IZO), or indium tin zinc oxide (ITZO), which may have excellent transparency, conductivity, and thermal stability.

The passivation layer 181 may be disposed on the second wiring layer 170 to flatten interlayer steps. The passivation layer 181 has an opening exposing a portion of the first electrode 175. The pixel electrode 191 may be disposed on the passivation layer 181 to be electrically connected to the first electrode 175 through the opening formed in the passivation layer 181.

A sealant SE and a dummy pattern DP for bonding the two display panels 100 and 200 may be disposed on the pad electrode PE.

The second display panel 200 may include a second substrate 210, color filters CF, light blocking members BM, and a common electrode 270.

The color filter CF and the light blocking members BM may be formed on the second substrate 210. The light blocking members BM are disposed between the color filters CF to divide regions of the pixels PX, to prevent a light leakage of the display device 1000, and to improve contrast in displayed images. Further, since the light blocking members BM clearly divide regions of the color filters CF, it is possible to prevent light incident on one region from intruding into another region. Therefore, it is possible to prevent mixture of different colors displayed by the display device 1000.

A common electrode 270 may be disposed on the color filters CF and the light blocking members BM.

The common electrode 270 may include indium tin oxide (ITO), indium zinc oxide (IZO), or indium tin zinc oxide (ITZO).

A liquid crystal layer 300 (including liquid crystal molecules), the sealant SE, and the dummy pattern DP may be disposed between the first display panel 100 and the second display panel 200. Between the first display panel 100 and the second display panel 200, an organic light emitting element, instead of the liquid crystal layer 300, may be implemented.

When the transistor TR is turned on in response to a gate signal applied to the gate electrode 121, a data signal is applied to the pixel electrode 191 through the transistor TR, and an electric field is generated between the pixel electrode 191 and the common electrode 270. The liquid crystal molecules of the liquid crystal layer 300 are rearranged in accordance with the electric field, and thus the pixel PX may display a grayscale corresponding to the data signal.

The sealant SE may surround edges of the two display panels 100 and 200 so as to prevent leakage of the liquid crystal layer 300 and may bond the display panels 100 and 200.

The sealant SE and the dummy pattern DP may be disposed on the pad electrode PE and may be disposed in the peripheral area PA of the display panel 10. In embodiments, the dummy pattern DP and/or the sealant SE may contact the side pads 400. The dummy pattern DP may be disposed at an outer circumference of the display panel 10 to protect the transistor TR against foreign substances such as moisture and dust particles. The dummy pattern DP may be an organic insulating material or an inorganic insulating material.

The sealant SE and the dummy pattern DP may be disposed on one side of the display panel 10, or may be disposed on four sides of the display panel 10 to surround the two display panels 100 and 200. The dummy pattern DP may include members respectively corresponding to side pads 400.

The flexible circuit board 500 and the driving circuit board 600 may be provided on the first side surface S1 of the display panel 10. The flexible circuit board 500 may be a flexible printed circuit board (FPCB) and may have a chip on film (COF) form. The data driver DD may be connected to the display panel 10 and the driving circuit board 600 in a tape carrier package (TCP) manner.

The side pads 400 may include a solution mixed with a metal. As an example, Ag, a hardener, and resin components may be included. The hardener may harden the metal such as Ag, may have a liquid phase before heating of the mixed solution, and may have a solid phase after the heating. A resin, which is a plastic material, may help a solid metal to have a liquid phase.

According to embodiments, convex portions of the pad pixels PE may prevent the laser beam LB (used for forming the side pads 400) from traveling through gaps between adjacent pad electrodes PE. Thus, potential damage to components of the display device may be prevented. Advantageously, satisfactory quality and reliability of the display device may be attained.

Figure 5:
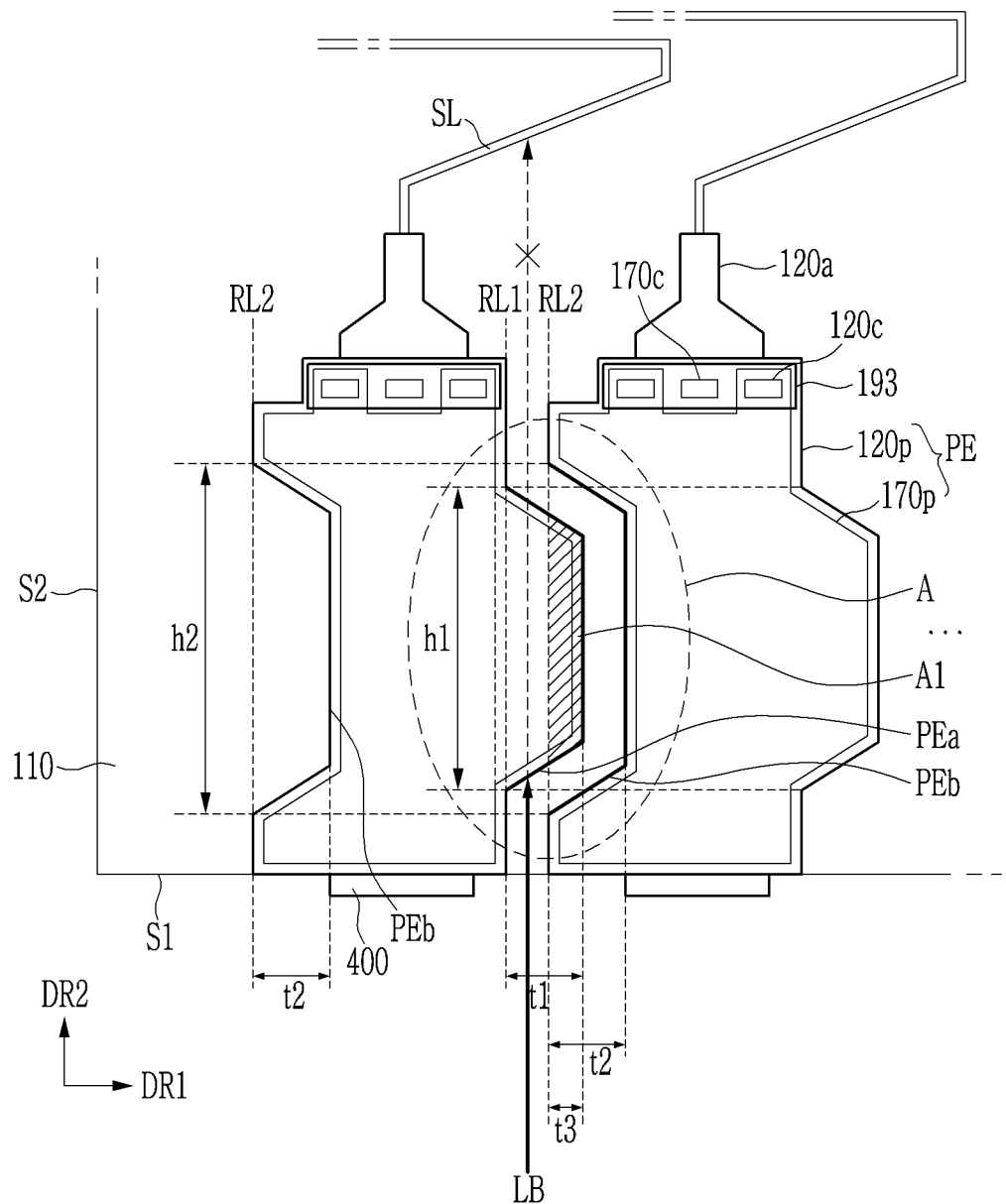
FIG. 5 illustrates a schematic top plan view of a portion of a display device according to an embodiment.

FIG. 5 illustrates a schematic top plan view of a portion of a display device according to an embodiment.

Referring to FIG. 5, the display device 1000 includes a first display panel 100, and the first display panel 100 includes pad electrodes PE and signal lines SL.

A pad electrode PE may include a first pad layer 120p and a second pad layer 170p. The second pad layer 170p is disposed on the first pad layer 120p. The two pad layers 120p and 170p may directly or indirectly contact each other.

Edges of the second pad layer 170p may correspond to edges of the first pad layer 120p. Referring to FIG. 3 and FIG. 5, the first pad layer 120p and the second pad layer 170p may have a same shape or similar shapes in a plan view of the display device 1000. As illustrated in FIG. 5, the second pad layer 170p may be smaller than the first pad layer 120p.

Each pad electrode PE includes a convex portion PEa and a recess portion PEb. The pad electrode PE may have a first side RL1 at a right side and a second side RL2 at a left side, and the first side RL1 may be parallel to the second side RL2.

The convex portion PEa protrudes from the first side RL1 to the right by a first width t1. The recess portion PEb is recessed from the second side RL2 to the right by a second width t2. The first width t1 may be equal to the second width t2. A convex portion PEa may be partially positioned in a corresponding recess portion PEb in an engaged portion A (or overlap structure A). The convex portion PEa and the recess portion PEb may have shapes corresponding to (i.e., matching) each other at the engaged portion A.

In the engaged portion A, a portion where the convex portion PEa and the corresponding recess portion PEb overlap in the second direction DR2 is referred to as an overlapped portion A1, and a width of the overlapped portion A1 is referred to as a third width t3.

A maximum length of the convex portion PEa (in the second direction DR2) is referred to as a first length h1, and a maximum length of the recess portion PEb is referred to as a second length h2. The first length h1 may be less than the second length h2 so that the recessed portion PEb may sufficiently surround the convex portion PEa in the engaged portion A. According to an embodiment, the first length h1 and second length h2 may be equal.

The signal lines SL may include the gate lines GL (see FIG. 1) and/or the data lines DL (see FIG. 1). The gate line GL may be formed in a same layer using a same material as the first wiring layer 120, and the data line DL may be formed in a same layer using a same material as the second wiring layer 170.

The side pads 400 are attached on the first side surface S1 of the display panel 10. The side pads 400 may connect the flexible circuit board 500 (including a data driver) to the display panel 10 and may respectively contact the corresponding pad electrodes PE. The pad electrodes PE may be disposed on a main surface of the first substrate 110.

A patterning step using a laser may be performed to form the side pads 400. A laser beam LB may be applied to pattern the side pads 400 to correspond to the respective pad electrodes PE.

According to embodiments, the pad electrodes PE may have the convex portions PEa and the recess portions PEb to block the laser beam LB. As illustrated in FIG. 5, the laser beam LB may be blocked by the convex portion PEa. Therefore, damage to the signal line SL and other components of the display panel 10 may be prevented. Advantageously, satisfactory quality and reliability of the display device 1000 may be attained.

The first wiring layer 120 (see FIG. 1) may include a first opening 120c, an auxiliary pad 120a, and a connector in the first pad layer 120p. The first opening 120c may be formed near a corresponding auxiliary pad 120 and a corresponding signal line SL. Although two first openings 120c are illustrated in FIG. 5, a number of first openings 120c may be configured according to particular embodiments.

The second pad layer 170p may include a second opening 170c. The second opening 170c may be disposed between the first openings 120c. Although one second opening 170c is illustrated, the position(s) and number of second openings 170c may be configured according to particular embodiments.

An auxiliary connecting member 193 may be disposed on a first opening 120c and a second opening 170c. The auxiliary connecting member 193 may be formed in a same layer using a same material as the pixel electrode 191 (see FIG. 4).

The auxiliary pad 120a may be connected to a corresponding first pad layer 120p and may be connected to a corresponding signal line SL.

Figure 6:
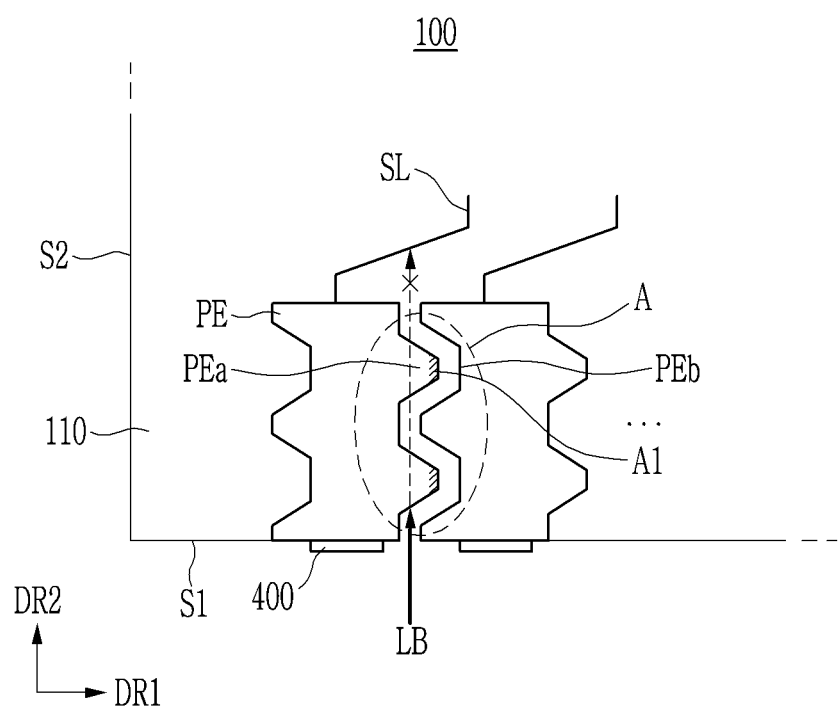
FIG. 6 illustrates a schematic top plan view of a portion of a display device according to an embodiment.
Figure 7:
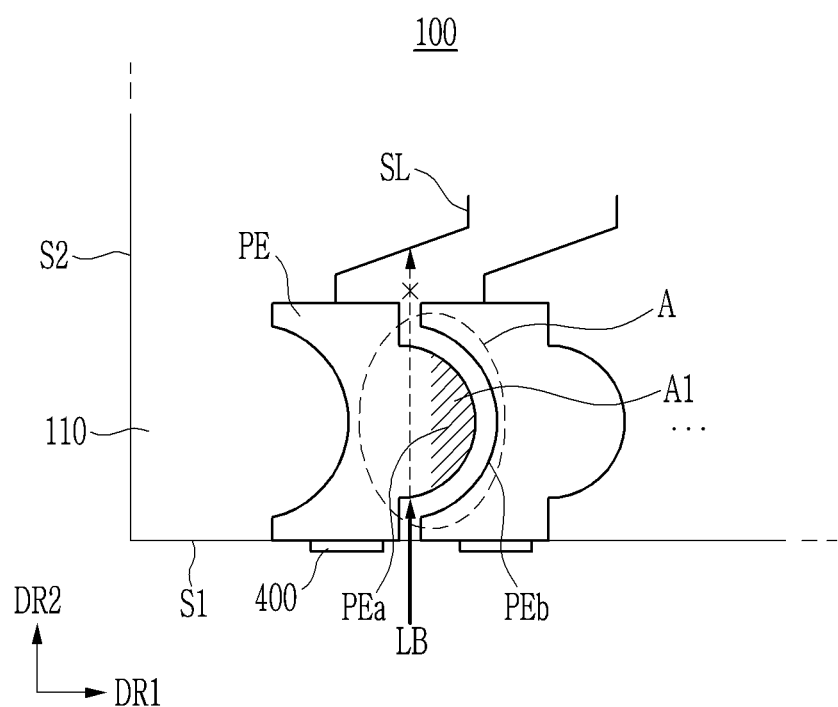
FIG. 7 illustrates a schematic top plan view of a portion of a display device according to an embodiment.

FIG. 6 and FIG. 7 illustrate schematic top plan views of a portion of a display device according to embodiments. In FIG. 6 and FIG. 7, although side pads 400 are illustrated to be disposed only on the first side surfaces S1, other side pads 400 may be disposed on the second side surfaces S2.

Referring to FIG. 6, the first display panel 100 includes a pad electrode PE. One pad electrode PE includes at least two convex portions PEa and at least two recess portions PEb at opposite sides. In embodiments, the quantity of the convex portions PEa of a pad electrode PE may be equal to the quantity of the corresponding recess portions PEb of an immediately neighboring pad pixel PE and may be respectively partially positioned inside the corresponding recess portions PEb.

In a process of forming the side pads 400 on the first side surface S1 of the display panel, the laser beam LB may be blocked and/or diverted by the convex portion PEa of the engaged portion A and may not reach the signal line SL. As a result, satisfactory reliability of the display device may be attained.

Referring to FIG. 7, each pad electrode PE includes a convex portion PEa and a recess portion PEb at opposite sides. In embodiments, each of the convex portion PEa and the recess portion PEb may include a curved portion for effectively blocking and/or diverting the laser beam LB.

In a process of forming the side pads 400 on the first side surface S1 of the display panel, the laser beam LB may be blocked and/or diverted by the convex portion PEa of the engaged portion A and may not damage components of the display device. As a result, satisfactory reliability of the display device may be attained.

Figure 8:
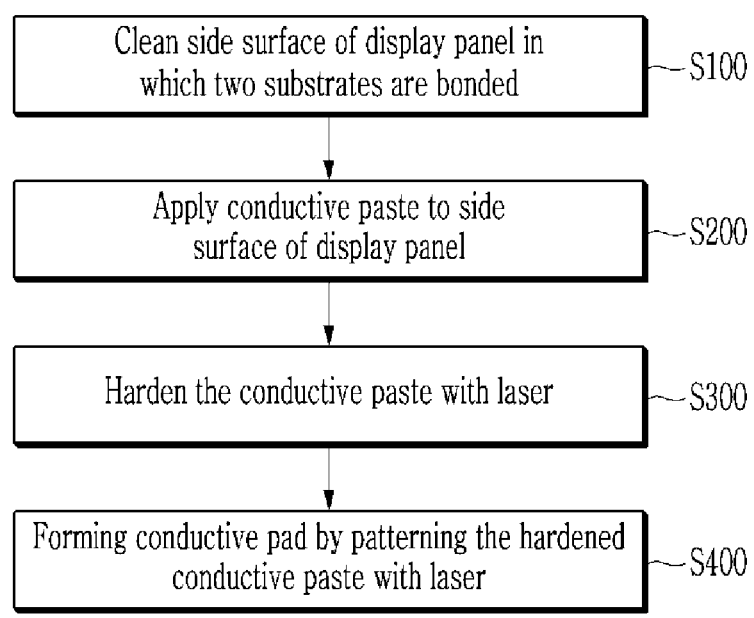
FIG. 8 illustrates a flowchart a method for manufacturing a display device according to an embodiment.
Figure 9:
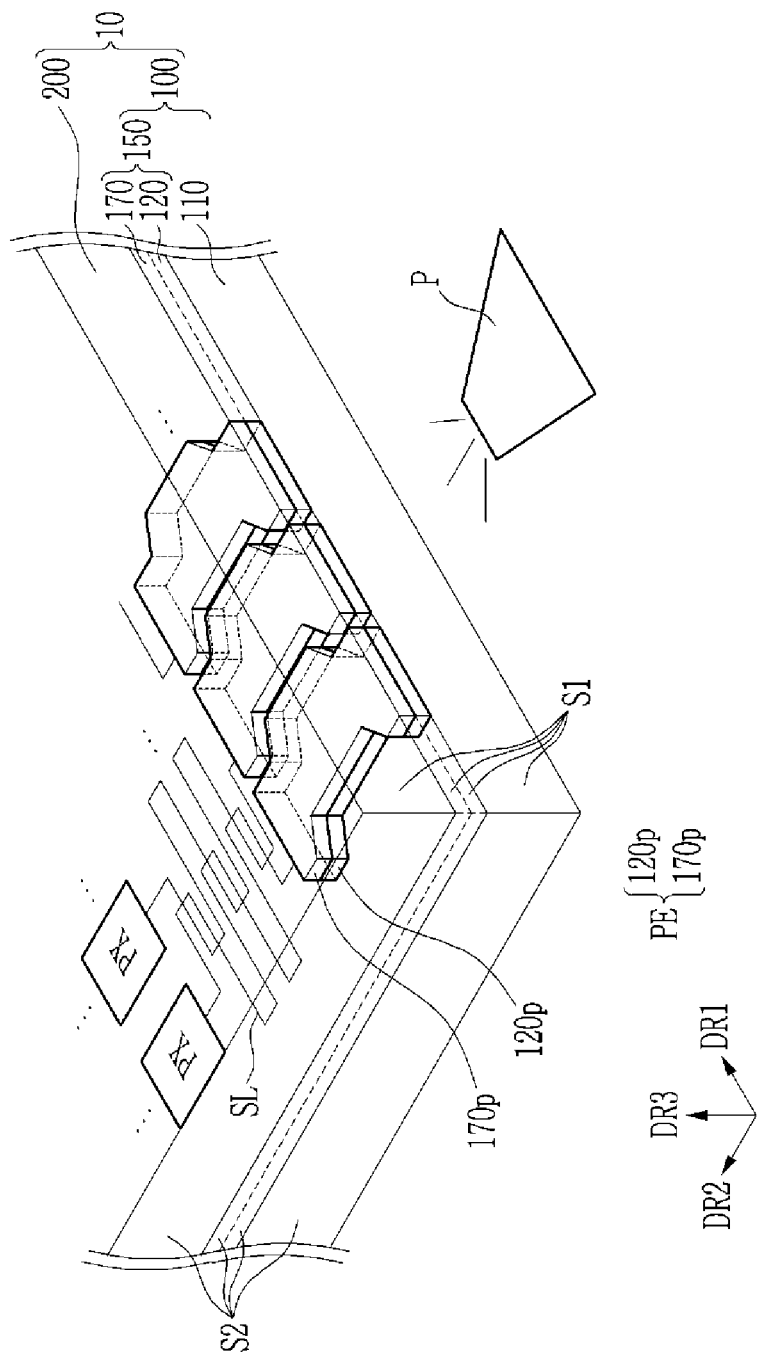
FIG. 9 illustrates a schematic perspective view of a display device according to an embodiment.
Figure 10:
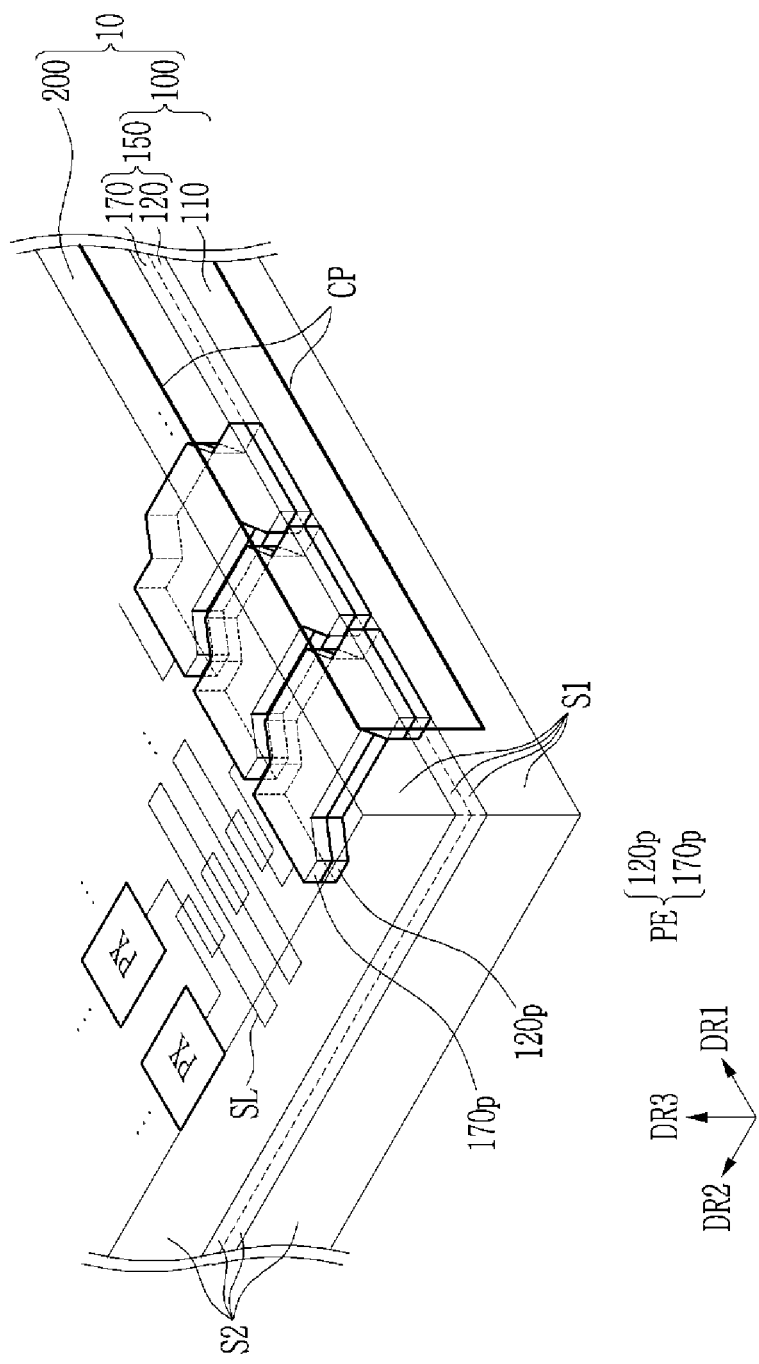
FIG. 10 illustrates a schematic perspective view of a display device according to an embodiment.
Figure 11:
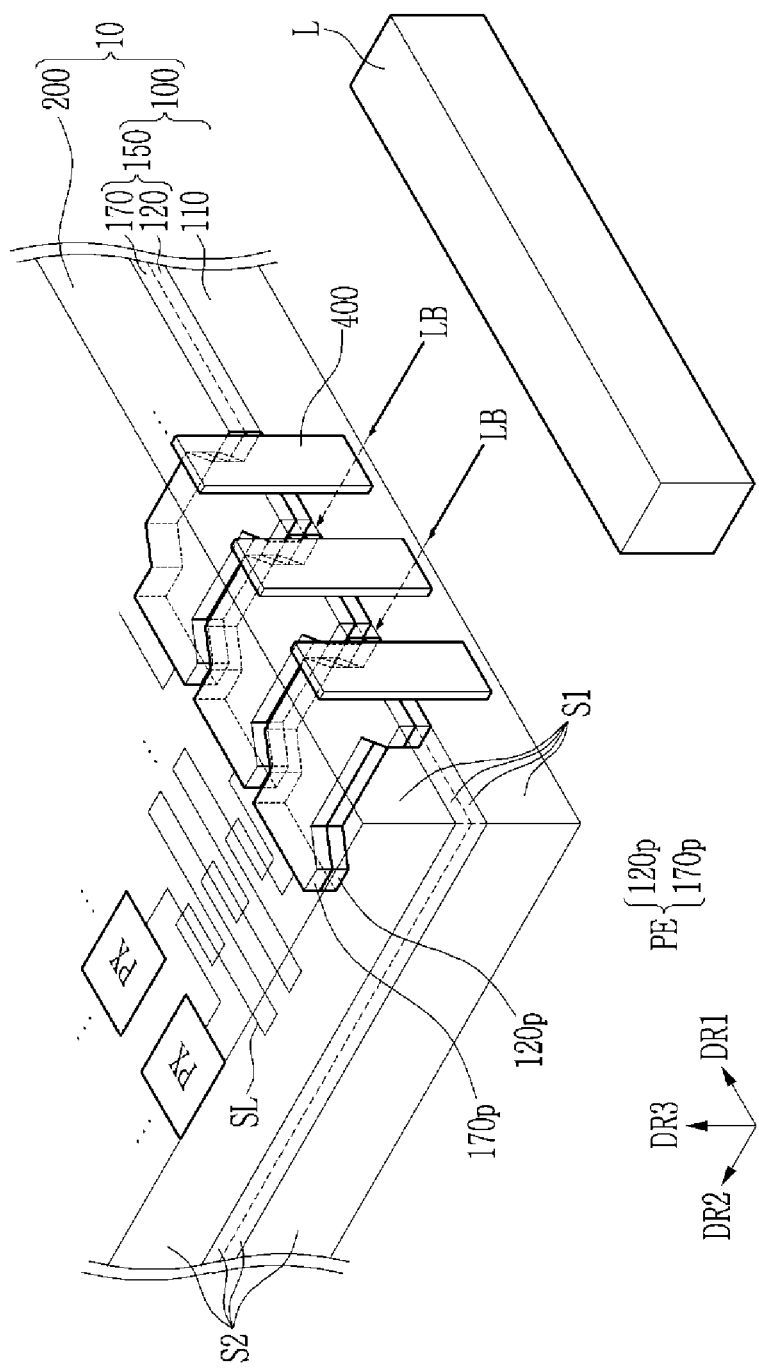
FIG. 11 illustrates a schematic perspective view of a display device according to an embodiment.

FIG. 8 illustrates a flowchart of a method for manufacturing a display device according to an embodiment, and each of FIG. 9, FIG. 10, and FIG. 11 illustrates a schematic perspective view of a display device according to an embodiment.

Referring to FIG. 9 and FIG. 8, the display panel 10 includes a combination of the first display panel 100 and the second display panel 200. The pad electrodes PE, the signal lines SL, and the pixels PX are disposed on the first substrate 110 of the first display panel 100. Each pad electrode PE has a convex portion PEa and a recess portion PEb on opposite sides, so that adjacent pad electrodes PE are engaged with each other.

One side surface S1 of the display panel 10 may be cleaned at atmospheric pressure using a plasma cleaning device P (step S100). Contaminants such as organic matters and Cu oxide on the side surface S1 may be substantially removed by plasma cleaning. The cleaning may improve adherence between the side surface S1 and a conductive paste CP that forms the side pads 400.

Next, referring to FIG. 10, the conductive paste CP is applied to the side surface S1 of the plasma-cleaned display panel 10 (step S200). The conductive paste CP is a material layer for forming the side pads 400.

The conductive paste CP may be printed on a predetermined application region of the first side surface S1 of the display panel 10. Alternatively, the conductive paste CP may be formed in the predetermined application region through a spraying technique.

The conductive paste CP is applied to the side surface S1 and contacts the pad electrodes PE (which are disposed on a main surface of the substrate 110).

According to embodiments, the conductive paste CP may be applied on one or more side surfaces of the display panel 10. As an example, when the flexible circuit board 500 is formed on both the first side surface S1 and the second side surface S2 as illustrated in FIG. 1, the conductive paste CP may be applied to the two side surfaces S1 and S2.

The conductive paste CP may include a metal having electrical conductivity. According to an embodiment, the conductive paste CP may include Ag, Cu, Au, and/or Al.

Next, the conductive paste CP applied on the display panel 10 may be heated and hardened with a laser (step S300). The conductive paste (CP) may be an Ag-mixed solution including Ag, a hardener, and a resin. When heated with a laser, the hardener may harden the Ag to solidify the conductive paste CP. Through this hardening step, the conductive paste CP may be firmly fixed to one or more side surfaces (e.g., the surface S1) of the display panel 10.

Next, referring to FIG. 11, the hardened conductive paste CP is patterned using a laser beam LB (provided by a laser device L) to form the side pads 400 (S400). The side pads 400 may respectively correspond to and contact the pad electrodes PE. The number of the side pads 400 may be equal to the number of the pad electrodes PE.

In embodiments, the laser beam LB may be blocked and/or diverted by the convex portions PEa of the pad electrodes PE and may not reach the signal lines SL and other components behind the pad electrodes PE. Accordingly, the laser beam LB may not damage the display device, and satisfactory reliability of the display device may be attained.

Further, since the convex portions PEa (and the recess portions PEb) may effectively protect components of the display device, no additional protective structures may be need. Advantageously, the size and/or cost of the display device may be minimized.

After the side pads 400 have been formed, referring again to FIG. 1, circuit elements such as the flexible circuit board 500 and the driving circuit board 600 may be attached to the side pads 400 for providing electrical signals to the display panel 10 through the side pads 400.

While example embodiments have been described, practical embodiments are not limited to the described embodiments. Practical embodiments cover various modifications and equivalent arrangements within the scope of the appended claims.

What is claimed is:

1. A display device comprising:
a first substrate including a first face and a second face;
a first conductive pad disposed on the first face;
a second conductive pad disposed on the first face and spaced from the first conductive pad;
a first pad electrode disposed on the second face, electrically connected to the first conductive pad, and including a protrusion;
a second pad electrode disposed on the second face, electrically connected to the second conductive pad, spaced from the first pad electrode, and including a recess, and
wherein the protrusion of the first pad electrode is partially inside the recess of the second pad electrode.

2. The display device of claim 1, further comprising:
a third conductive pad disposed on the first face and spaced from the second conductive pad; and
a third pad electrode disposed on the second face, electrically connected to the third conductive pad, spaced from the second pad electrode, and including a concave structure, wherein
the second pad electrode further includes a convex structure, and
the convex structure of the second pad electrode is partially inside the concave structure of the third pad electrode.

3. The display device of claim 1, wherein
the protrusion is wider than a gap between the first pad electrode and the second pad electrode in a lengthwise direction of the first face, and
the gap is positioned between the protrusion and the first face.

4. The display device of claim 1, wherein
a shape of the protrusion corresponds to a shape of the recess.

5. The display device of claim 1, further comprising: a signal line disposed on the second face and electrically connected to at least one of the first pad electrode and the second pad electrode, wherein
the protrusion is positioned between the signal line and the first face.

6. The display device of claim 1, wherein
a first edge of the protrusion is positioned between a second edge of the protrusion and the first face and is curved or oblique relative to the first face in a plan view of the display device.

7. The display device of claim 1, wherein
each of the protrusion and the recess has a polygonal shape in a plan view of the display device.

8. The display device of claim 1, wherein
the first pad electrode includes at least two protrusions,
the second pad electrode includes at least two recesses, and
the at least two protrusions are partially inside the at least two recesses, respectively.

9. The display device of claim 1, wherein
each of the protrusion and the recess has a curved portion in a plan view of the display device.

10. The display device of claim 1, further comprising: a second substrate, wherein
the first pad electrode and the second pad electrode are positioned between the first substrate and the second substrate, and
the first conductive pad and the second conductive pad are disposed on a first face of the second substrate.

11. The display device of claim 1, wherein
the first pad electrode includes a first pad layer and a second pad layer,
a material of the first pad layer is different from a material of the second pad layer, and
at least one of the first pad layer and the second pad layer directly contacts the first conductive pad.

12. The display device of claim 11, wherein
the first pad layer directly contacts the second pad layer.

13. The display device of claim 11, further comprising:
a gate electrode overlapping the second face and configured to receive a gate signal; and
a data line overlapping the second face and configured to transmit a data signal,
wherein
the material of the first pad layer is identical to a material of the gate electrode, and
the material of the second pad layer is identical to a material of the data line.

14. The display device of claim 11, further comprising: a transistor, wherein
at least one of the material of the first pad layer and the material of the second pad layer is identical to a material of an electrode of the transistor, and
the transistor is disposed on the first substrate.

15. The display device of claim 10, further comprising:
a color filter disposed on the second substrate; and
a light blocking member disposed on the second substrate,
wherein at least one of the color filter and the light blocking member overlaps the first pad electrode.

16. The display device of claim 1, further comprising: a data driver or a gate driver electrically connected to at least one of the first conductive pad and the second conductive pad.

17. The display device of claim 1, wherein
the first conductive pad directly contacts the first pad electrode, and
the second conductive pad directly contacts the second pad electrode.

* * * * *